(12) United States Patent
Iwasaki et al.

(10) Patent No.: US 7,473,942 B2
(45) Date of Patent: Jan. 6, 2009

(54) LIGHT-EMITTING DEVICE WITH AT LEAST ONE TRIPLE JUNCTION FORMED IN A PLANE

(75) Inventors: Tatsuya Iwasaki, Tokyo (JP); Tohru Den, Tokyo (JP); Katsuya Oikawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 468 days.

(21) Appl. No.: 11/214,853

(22) Filed: Aug. 31, 2005

(65) Prior Publication Data

US 2006/0043410 A1    Mar. 2, 2006

(30) Foreign Application Priority Data

Sep. 1, 2004    (JP) .............................. 2004-254837

(51) Int. Cl.
*H01L 33/00*    (2006.01)
(52) U.S. Cl. .............................. 257/103; 257/E33.065
(58) Field of Classification Search .................. 257/99, 257/103, E33.019, E33.065
See application file for complete search history.

(56) References Cited

U.S. PATENT DOCUMENTS

| | | | |
|---|---|---|---|
| 5,593,335 A | 1/1997 | Suzuki et al. ................. 445/50 |
| 6,160,347 A | 12/2000 | Iwasaki et al. .............. 313/545 |
| 6,231,412 B1 | 5/2001 | Kawade et al. ................. 445/3 |
| 6,283,815 B1 | 9/2001 | Iwasaki et al. ................. 445/41 |
| 6,936,854 B2 | 8/2005 | Iwasaki et al. ................. 257/81 |
| 6,970,610 B2 | 11/2005 | Iwasaki ........................ 385/14 |
| 6,972,146 B2 | 12/2005 | Den et al. .................... 428/138 |
| 2005/0053773 A1 | 3/2005 | Fukutani et al. ............. 428/209 |
| 2005/0062033 A1 | 3/2005 | Ichihara et al. ............... 257/17 |
| 2006/0120918 A1 | 6/2006 | Fukutani et al. .............. 422/57 |
| 2006/0172116 A1 | 8/2006 | Den et al. .................... 428/137 |

FOREIGN PATENT DOCUMENTS

| | | |
|---|---|---|
| JP | H05-283165 | 10/1993 |
| JP | 2002-280185 | 9/2002 |
| JP | 2004-066447 | 3/2004 |

OTHER PUBLICATIONS

English translation of JP 2002280185 A, supplied by the Japanese Patent Office.*

* cited by examiner

*Primary Examiner*—Thomas L Dickey
(74) *Attorney, Agent, or Firm*—Fitzpatrick, Cella, Harper & Scinto

(57) ABSTRACT

A light-emitting device is provided that is excellent in light emission efficiency and stability. The light-emitting device has a first part of a first dielectric constant, a second part of a second dielectric constant and a third part of a third dielectric constant, and has a triple junction where they are in contact with one another. Moreover, a first and a second electrode are provided for applying a voltage for controlling an electric field at the triple junction and in the vicinity thereof. Further, at least one of the first, the second and the third parts is constituted by light-emitting material, and the triple junction forms a closed line.

8 Claims, 9 Drawing Sheets

VOLTAGE APPLYING DIRECTION $\varepsilon 2 > \varepsilon 3 > \varepsilon 1$ $\varepsilon 2 > \varepsilon 1 > \varepsilon 3$ $\varepsilon 1 > \varepsilon 2 > \varepsilon 3$

LIGHT-EMITTING DEVICE WITH AT LEAST ONE TRIPLE JUNCTION FORMED IN A PLANE

BACKGROUND OF THE INVENTION

1. Field of the Invention

The present invention relates to a light-emitting device and a production method thereof.

2. Related Background Art

As a light-emitting device, two types of devices are known.

One is a device of current injection type, in which carrier (electron and holes) are injected into p-n junction and light is emitted by electron-hole recombination. This type of devices of a light emitting diode and a laser diode etc. is operated under relatively low voltages (<10V) and may be driven under DC condition.

Another is a device using electric field excitation, in which high electric field across stacked dielectric layer and light-emitting layer is used to accelerate electrons and excite the light-emitting layer. This type of device of inorganic EL etc. is operated under relatively high voltages and is driven under AC condition. A general inorganic EL has a double insulating structure with an electrode layer, a first insulating layer, a light-emitting layer, a second insulating layer, an electrode layer being stacked on a glass substrate.

These two types of device are different in their operation principles.

In this specification, the term "an electric field excitation light-emitting device" indicates the latter type of device using electric field excitation.

A flat panel display (FPD) having such a light-emitting device applied thereto has been attracting attention. As an FPD, an organic electroluminescence display (organic EL), an inorganic electroluminescence display (inorganic EL), a light-emitting diode display (LED display) are included.

A light-emitting diode can be driven with a low voltage and is excellent in stability, but requires high temperature process for crystal growth, and is therefore difficult to be formed on a glass substrate and a plastic substrate. Therefore, as a display, its range of application is limited.

An organic EL display can be driven with a low voltage and can be formed on a glass substrate or a plastic substrate, but has a problem in reliability and durability.

With regard to inorganic display, production of a large area display is comparatively easy, and high resistance to use environment can be expected, but the high drive voltage is currently problematic. Recently, in Japanese Patent Application Laid-Open No. 2002-280185, a technology on a thin film EL device with quantum size layers of alternately stacked films or a porous layer has been disclosed for improving light emission efficiency.

SUMMARY OF THE INVENTION

It is, therefore, an object of the present invention to provide a novel light-emitting device which is excellent in light emission efficiency, stability and production cost.

According to a first aspect of the present invention, there is provided a light-emitting device comprising:

a first part of a first dielectric constant;

a second part of a second dielectric constant;

a third part of a third dielectric constant;

a triple junction where the first, the second and the third parts are in contact with one another; and a first and a second electrodes, wherein at least one of the first, the second and the third parts is constituted by light emitting material and the triple junction forms a closed line.

Further, the light emitting material is excited by using electric field between the first electrode and the second electrode.

According to a second aspect of the present invention, there is provided an image display apparatus using the above-mentioned light-emitting device.

According to a third aspect of the present invention, there is provided a method of producing an light-emitting device comprising the steps of:

1) forming a first part of a first dielectric constant; and 2) forming on the first part a thin film layer comprising a second part of a second dielectric constant and a third part of a third dielectric constant, so as to form a triple junction with geometry of a closed line, where the three parts of the first, the second and the third parts are in contact with one another.

According to a fourth aspect of the present invention, there is provided a method of producing an light-emitting device comprising the steps of:

a) forming a member having, on a surface thereof, a first part of a first dielectric constant and a second part of a second dielectric constant; and b) forming on the member a third part of a third dielectric constant, so as to form a triple junction with geometry of a closed line, where the three parts of the first, the second and the third parts are in contact with one another.

In the present invention, it is preferred that the triple junction has geometry of a closed line, especially a closed curve.

With the device and production method in accordance with the present invention, a light-emitting device that is excellent in emission uniformity in a light-emitting surface (plane) and can be driven stably at a comparatively low voltage can be realized.

DESCRIPTION OF THE PREFERRED EMBODIMENTS

A light-emitting device in accordance with the present invention will be described.

Figure 1A:
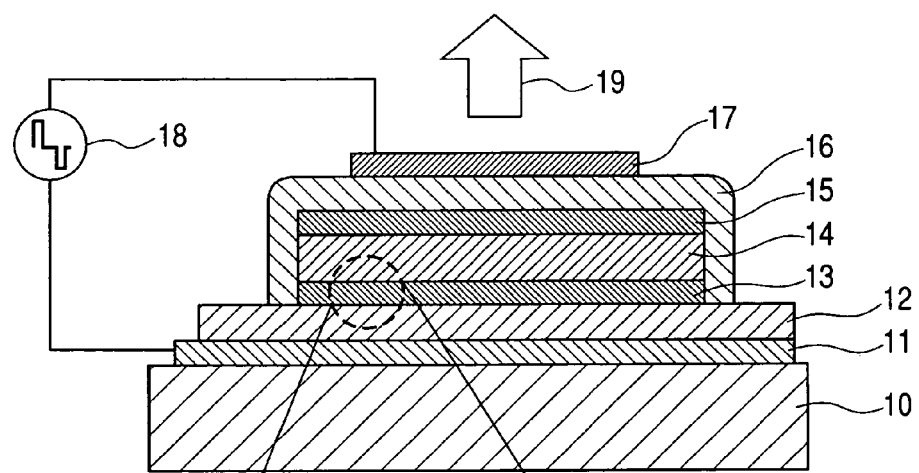
FIG. 1A is a schematic sectional view showing a configuration of a light-emitting device in accordance with the present invention.
Figure 1B:
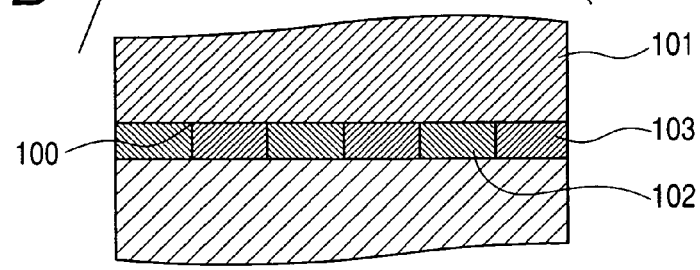
FIG. 1B is an enlarged view of a portion indicated by a chain circle in FIG. 1A.

FIG. 1A is a schematic view showing a configuration of a light-emitting device in accordance with the present invention, and FIG. 1B is an enlarged view of a portion indicated by a chain circle in FIG. 1A.

Here, reference numeral 10 denotes a substrate; reference numeral 11 denotes an electrode layer; reference numeral 12 denotes a first insulating layer; reference numeral 13 denotes a first fine-structured layer; reference numeral 14 denotes a light-emitting layer; reference numeral 15 denotes a second fine-structured layer; reference numeral 16 denotes a second insulating layer; reference numeral 17 denotes a transparent electrode layer (second electrode layer); reference numeral 18 denotes a power supply; and reference numeral 19 denotes light.

As shown by the enlarged view of FIG. 1B, the fine-structured layer, which has a second part 102 of a second dielectric constant and a third part 103 of a third dielectric constant, is in contact with a first part 101 (light-emitting layer 14) of a first dielectric constant. That is, the second part 102 and the third part 103 are in contact with the first part 101 to form a triple junction 100.

Figure 2A:
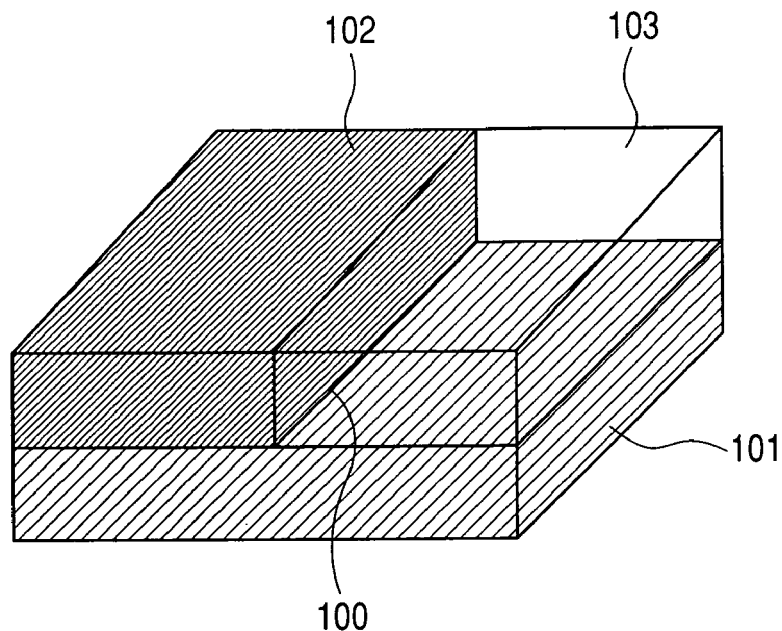
FIGS. 2A and 2B are perspective views illustrating a triple junction.
Figure 2B:
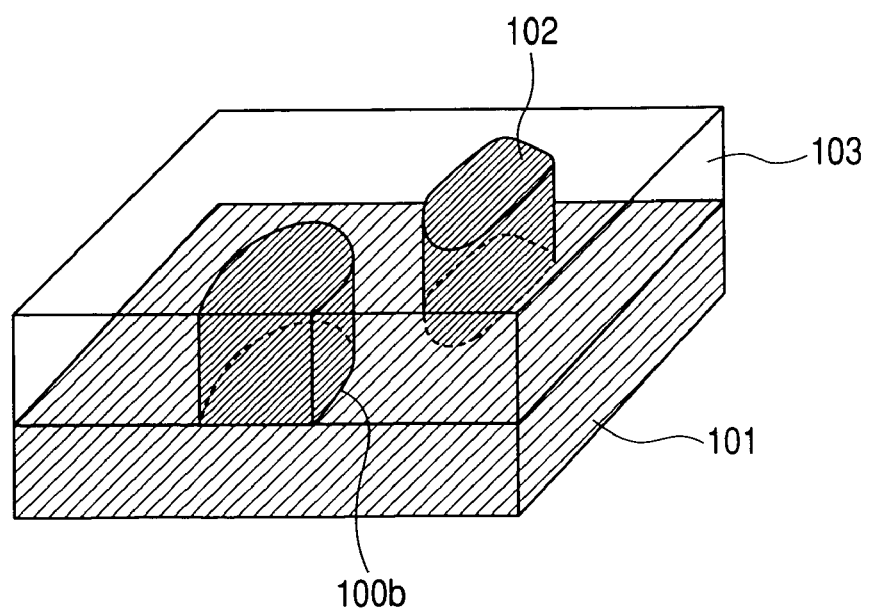

The triple junction will be described. As shown in FIGS. 2A and 2B, the triple junction is a junction where a first part 101 of a first dielectric constant $\in 1$, the second part 102 of a second dielectric constant $\in 2$ and the third part 103 of a third dielectric constant $\in 3$ are mutually in contact with one another.

As the geometry of the triple junction, there are included geometry where the three materials are in contact with one another at a point and geometry where the three materials are in contact with one another in a line as shown in FIG. 2A.

In the present invention, the triple junction with geometry of a closed line is preferable. The triple junction with geometry of a closed line used in the present invention may have vertexes as in a polygon, or may be curved as shown in FIG. 2B (without vertex). Alternatively, the triple junction with geometry of a closed line may be a closed line consisting of a curve and a straight line. In the figure, reference numeral 100b denotes a triple junction with geometry of a closed curve. In the light-emitting device in accordance with the present invent, provision of only a single triple junction maybe included. Also, provision of a plurality of triple junctions is more preferable. A closed curve makes it possible to dispose the triple junction in high density, thereby providing a device with a higher light emission. Further, the configuration having a plurality of closed curves is more preferable from the point of view of higher density of the triple junction.

In the light-emitting device in accordance with the present invention, because excitation and light emission mainly take place in a triple junction and in the vicinity thereof, it is preferred that the triple junctions are provided densely. By providing the triple junctions densely, improvement of luminance accompanied with increase in light-emitting sites, and improvement of uniformity of in-plane luminance distribution can be accomplished.

Moreover, from the point of view of providing the triple junctions densely, it is preferable that the second part 102 of the second dielectric constant in FIG. 2B is small, and for example, that the length of the closed line of triple junction is not more than 1 μm.

In addition, in order to intensify an electric field strength locally at the triple junction, it is preferred that the spacing between adjacent triple junctions is large to a certain extent, and, for example, that the spacing is 10 nm or more.

The transparent electrode layer 17 and the electrode layer 11 are electrically connected to the power supply 18 for driving. The power supply may be a pulse power supply, an AC power supply and the like.

Thus, the light-emitting device in accordance with the present invention has a first part of a first dielectric constant, a second part of a second dielectric constant and a third part of a third dielectric constant, and has a triple junction where they are in contact with one another. Moreover, the device has a first and a second electrodes for applying a voltage for controlling an electric field at the triple junction and in the vicinity thereof. Further, at least one of the first, the second and the third parts is a light emitting material and the triple junction forms a closed line.

When applying a voltage from the power supply 18 to the electrodes 11, 17, an electric field is generated between the electrodes, and a relatively larger electric field strength maybe generated at the triple junction and in the vicinity thereof locally. That is, electrons injected from, for example, an interface state between the cathode side (low potential side) insulating layer and the fine-structured layer are efficiently accelerated via the triple junction to generate hot electrons having a high energy. The sufficiently energized hot electrons will excite the light-emitting material(layer) efficiently, so that good light emission can be implemented. The electrons injected into the light-emitting layer are trapped by, for example, an interface state between the anode side insulating layer and the fine-structured layer. Successively, when an external pulse voltage in an opposite polarity is applied, the anode and the cathode are reversed, so that the same excitation and light emission process is repeated in the opposite direction.

Thus, in the electric field excitation light-emitting device in accordance with the present invention, efficient excitation is achieved by means of a local high electric field generated at the triple junction and in the vicinity thereof. Thereby, this gives rise to efficient light emission.

In addition, in the present invention, because many triple junctions (light-emitting sites) are densely dispersed in the device, the light-emitting layer can be excited uniformly throughout the plane.

In addition, because a number of local light-emitting sites (triple junctions) are uniformly dispersed in the plane, damage to the device resulting from energy loss due to concentration to one portion of the device hardly takes place. This can provide a light-emitting device that is excellent in reliability and stability.

In general, for operating an electric field excitation light-emitting device it is necessary to give rise to an electric field strength of a certain threshold value or more. However, in the present invention, a relatively low external voltage makes it possible to generate a local electric field strength of the threshold value or more at the triple junction. At this time, the electric field strength at a portion apart from the triple junction is lower than the triple junction. Such a configuration enables light emission with a low voltage, and moreover low voltage operation enables to improve durability of the device against an excess voltage.

FIGS. 3A, 3B, 3C, 3D, 3E, 3F, and 3G are views showing a configuration example of triple junctions. The figures are sectional views and each triple junction has geometry of a line in the direction perpendicular to the drawing plane. As with FIG. 1A, it is presumed that an external voltage is applied in the upward and downward direction in the figures with electrodes (not shown). In the figures, the direction of external voltage application is indicated by an arrow.

Figure 3A:
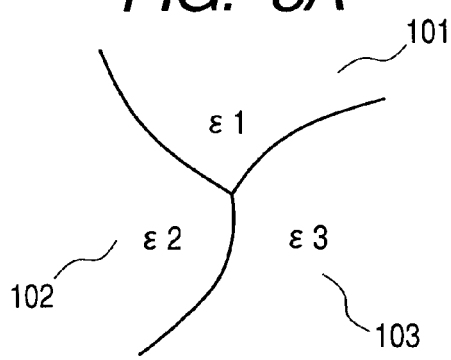
FIGS. 3A, 3B, 3C, 3D, 3E, 3F, and 3G are sectional views showing a configuration example of a triple junction with geometry of a closed line.

FIG. 3A shows a configuration having the least limit to the triple junction. A first part 101 of a first dielectric constant $\in 1$, a second part 102 of a second dielectric constant ∈2 and a third part 103 of a third dielectric constant ∈3 are in contact one another.

Figure 3B:
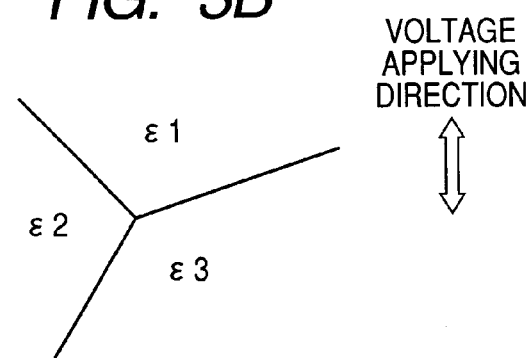

FIG. 3B is an example in which an interface between a first part and a second part and an interface between a second part and a third part and an interface between a first part and a third part are each configured as a substantially straight line in the sectional view.

Figure 3C:
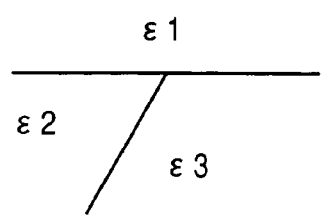

FIG. 3C is a case where a interface between a first part and a second part and an interface between the first part and a third part are connected to form a straight line continuously, and moreover the straight line is perpendicular to the direction of the voltage application. Such a configuration can be produced by stacking a fine-structured layer consisting of a second part and a third part and a layer of a first dielectric constant, and therefore can be said to be comparatively readily producible. In addition, even if the difference between the second dielectric constant and the third dielectric constant is small, a comparatively large local electric field arises in the vicinity of the triple junction, which is therefore preferable.

Figure 3D:
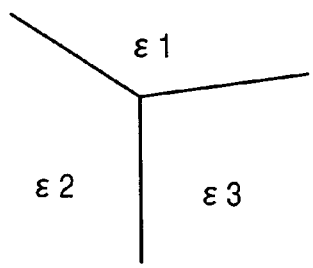

FIG. 3D is a case where an interface between a second part and a third part is parallel to the direction of voltage application. Even if the difference between the second dielectric constant and the third dielectric constant is comparatively small, such a configuration gives rise to a comparatively large local electric field in the vicinity of the triple junction, which is therefore preferable.

Figure 3E:
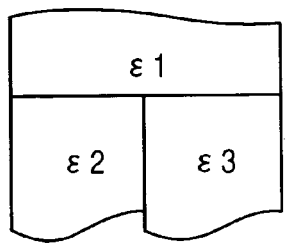
Figure 3F:
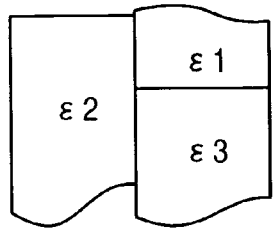
Figure 3G:
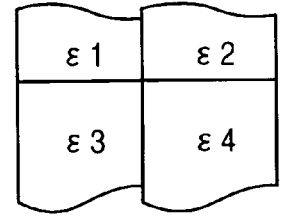

The configuration shown in FIG. 3E having the characteristics of FIGS. 3C and 3D in combination is more preferable. As another example, the configuration shown in FIG. 3F may be included. In addition, the foregoing description has been made taking as an example a triple junction where three materials are in contact with one another. Also, a junction where more than three (e.g., four) parts are in contact with one another is shown in FIG. 3G. This junction can be expected to exhibit those effects which are equivalent to or better than the above-mentioned effects.

Figure 4A:
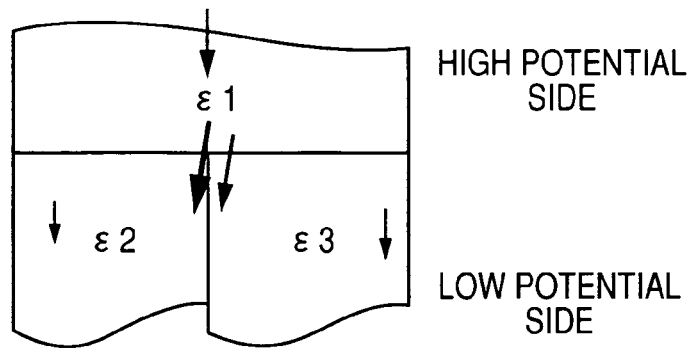
FIGS. 4A, 4B and 4C are sectional views showing a magnitude relationship of dielectric constants and an electric field around a triple junction.
Figure 4B:
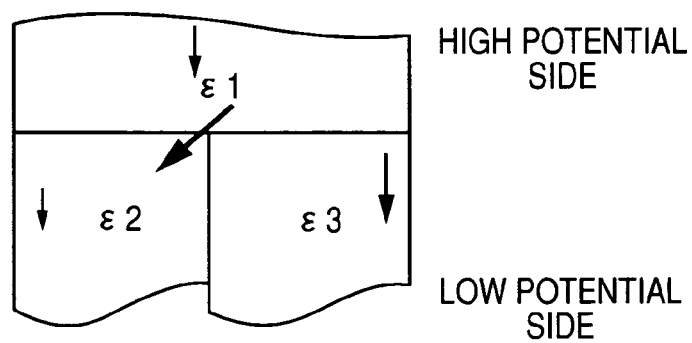
Figure 4C:
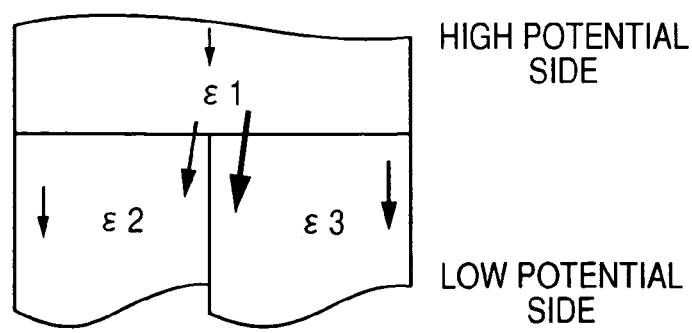

Taking the configuration shown in FIG. 3E as an example, electric field strengths in the vicinity of the triple junction are shown in FIGS. 4A, 4B and 4C. FIGS. 4A, 4B and 4C are different from each other in magnitude relationship between dielectric constants ∈1, ∈2 and ∈3. In the figures, the size and direction of an arrow indicate the relative strength and direction of an electric field.

In every case, as shown in FIGS. 4A, 4B and 4C, the electric field strength at the triple junction and in the vicinity thereof is larger than at the peripheral parts. In particular, the case of FIG. 4B is characterized in that the local electric field strength in the vicinity of the triple junction is intensified compared with the cases of FIGS. 4A and 4C. Moreover, it is further characterized in that the portion of this intensified electric field strength is narrow (highly localized) and the microscopic direction of the electric field vector is inclined with respect to the direction of voltage application (macroscopic electric field direction) This configuration shown in FIG. 4B can attain a locally intensified electric field strength with a small external voltage, and therefore is one of preferable examples from the point of view of reducing the drive voltage.

There is no particular limitation to the values of dielectric constants ∈1, ∈2 and ∈3, and any value between 1 to several 1000 is available, but when the relative ratio is large, the local electric field strength in the vicinity of the triple junction can be intensified, which is therefore preferable.

In addition, as to the first material, the second material and the third material disposed around the above described triple junction, there is no particular limitation as long as it is a dielectric material. From the point of view of stable dielectric property and effective electron acceleration (at the time of light emission), oxides are preferable. For example, $SiO_2$, $Al_2O_3$, $TiO_2$, $Y_2O_3$, $Ta_2O_5$, $HfO_2$, $ZrO_2$, $La_2O_3$, $MgO$, $BaTiO_3$ and the like are included. In order to control the dielectric constant, composite oxides thereof may also be employed.

In the present invention, at least one of the first, the second and the third parts may be comprised of a light-emitting material. Thereby, electrons accelerated with the electric field in the vicinity of the triple junction can excite the light-emitting material effectively.

Figure 5A:
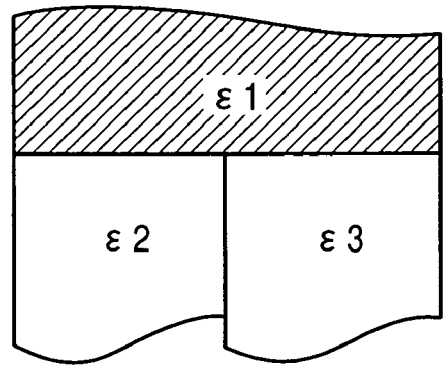
FIGS. 5A, 5B and 5C are sectional views showing an example of disposing a light-emitting material.

For example, as shown in FIG. 5A, a configuration is included in which a layer of a light-emitting material (a first part of a first dielectric constant ∈1) and a fine-structured layer consisting of a second part of a second dielectric constant ∈2 and a third part of a third dielectric constant ∈3 are stacked on each other. The example shown in FIGS. 1A and 1B also has the same configuration as above.

Figure 5B:
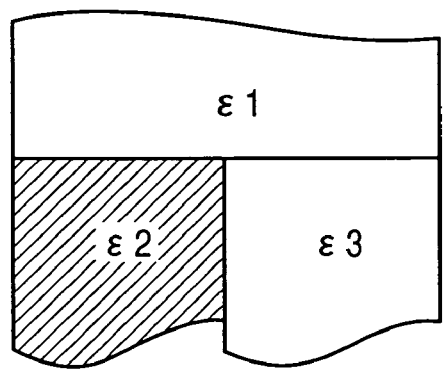
Figure 5C:
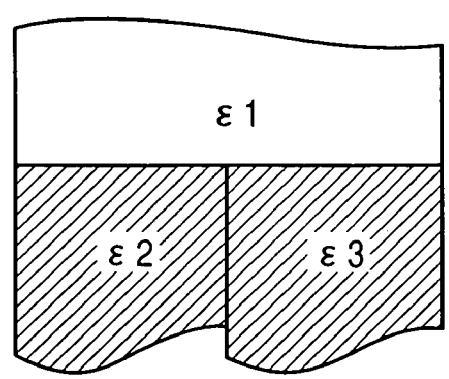

Otherwise, as shown in FIG. 5B, a configuration is also included in which a layer of a first dielectric constant ∈1 and a fine-structured layer consisting of a light-emitting part (a second part of a second dielectric constant ∈2) and a third part of a third dielectric constant ∈3 are stacked on each other. FIG. 5C is an example in which the third part of the third dielectric constant in FIG. 5B is also constituted as a light-emitting part. Further, all of the first, the second and the third parts can be constituted of light-emitting material. When the respective parts constituted by light-emitting material are designed to provide different emission colors, multi-color mixing or a white-light-emitting device can be attained.

In addition, in order to excite a light-emitting material effectively with electrons accelerated by an intense electric field in the vicinity of a triple junction, it is preferable to dispose the light-emitting material at a starting point of the arrow (thick arrow) indicating an intensified electric field in FIGS. 4A, 4B and 4C. That is, taking the case of FIG. 4B referred to as a preferable example above, the arrangement of FIG. 5A is preferable in which the first part of dielectric constant ∈1 is a light-emitting material. On the other hand, in the case where the direction of voltage application is reversed, the direction of electric field (the direction of the arrow) is reversed, and therefore an arrangement of disposing a light-emitting material at the final point of the arrow is also preferable. That is, in the case of FIG. 4B which was taken as a preferable example above, the disposition shown in FIG. 5B in which the second part of dielectric constant ∈2 is a light-emitting material.

As the light-emitting material, there are included light-emitting materials having an emission center, such as $ZnS$:Mn, $SrS$:(Ce,Eu), $CaS$:Eu, $ZnS$:(Tb,F), $CaS$:Ce, $SrS$:Ce, $CaGa_2S_4$:Ce, $BaAl_2S_4$:Eu, $Ga_2O_3$:Eu, $Y_2O_3$:Eu, $Zn_2SiO_4$:Mn, $ZnGa_2O_4$:Mn, $Y_2O_2S$:$Eu^{3+}$, $Gd_2O_2S$:$Eu^{3+}$, $YVO_4$:$Eu^{3+}$, $Y_2O_2S$:(Eu,Sm), $SrTiO_3$:Pr, $BaSi_2Al_2O_8$:$Eu^{2+}$, $BaMg_2Al_{16}O_{27}$:$Eu^{2+}$ and $Y_{0.65}Gd_{0.35}BO_3$:$Eu^{3+}$, $La_2O_2S$:$Eu^{3+}$, $Ba_2SiO_4$:$Eu^{2+}$, $Zn(Ga,Al)_2O_4$:Mn, $Y_3(Al,Ga)_5O_{12}$:Tb, $Y_2SiO_5$:Tb, $ZnS$:Cu, $Zn_2SiO_4$:Mn, $BaAl_2Si_2O_8$:$Eu^{2+}$, $BaMgAl_{14}O_{23}$:$Eu^{2+}$, $Y_2SiO_5$:Ce, and $ZnGa_2O_4$:Eu.

In addition to the above mentioned, there may also be used tungsten oxides such as $ZnWO_4$, $MgWO_4$ and the like; molybdenum oxides such as $ZnMoO_4$, $SrMO_4$ and the like; vanadium oxides such as $YVO_4$ and the like; and europium oxides such as $Eu_2SiO_4$, $EuSiO$ and the like; organic light-emitting materials including $Alq_3$ and Ir(ppy); semiconductor materials including ZnSe, CdSe, ZnTe, GaP, GaN, and ZnO; and fine particles thereof.

Further, FIGS. 1A and 1B are conceptual diagrams of a device of a type in which a light is taken out from a side opposite to the substrate side of the device. On the other hand, by forming the electrode layer 11 of a transparent electrode, a device of a type in which a light is taken out from the substrate side of the device is also available. In addition, FIGS. 1A and 1B feature a device of a double insulation type having the first and the second insulating layers, and these insulating layers can enhance the insulating characteristics of the device and can improve reliability of the device. Also the insulating layers can be omitted in the case where only the light-emitting layer and the fine-structured layer can provide sufficient insulating characteristics. Alternatively, either one of the insulating layers may be provided.

Further, in the configuration shown in FIGS. 1A and 1B, the first and the second fine-structured layers are provided and the triple junctions are formed on the interfaces of the respective layers with the light-emitting layer. Also, the configuration only either one of the fine-structured layers may be provide.

Figure 8:
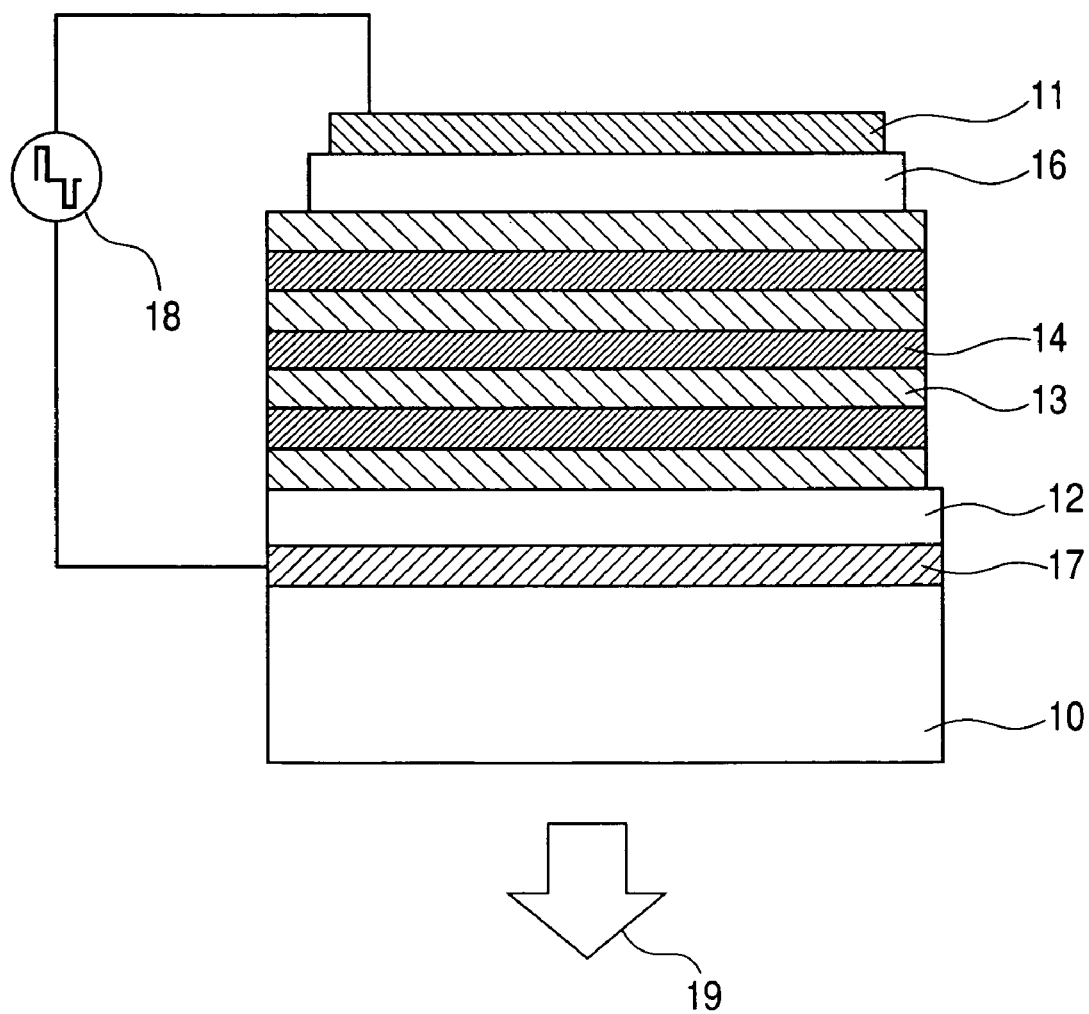
FIG. 8 is a schematic view showing an example of a light-emitting device in accordance with the present invention.

Moreover, FIGS. 1A and 1B feature the two fine-structured layers and the single light-emitting layer. Also, as shown in FIG. 8, a plurality of fine-structured layers and a plurality of light-emitting layers may be stacked on each other alternately.

The respective layers of the configuration shown in FIGS. 1A and 1B 1 will be described.

At first, the fine-structured layers 13 and 15 will be described.

FIGS. 7A, 7B, 7C, and 7D are schematic views each showing an example of a structure of a fine-structured layer 13. The fine-structured layer 13 has, inside the layer plane, a first part 21 consisting of a first material and a second part 22 consisting of a second material. In particular, it is characterized by having a fine structure of a size in the order of submicron to nanometer. In FIGS. 1A and 1B, for convenience of presentation, the first parts and the second parts are depicted in a large size, but their actual sizes are very small compared with the size of the device.

Figure 7A:
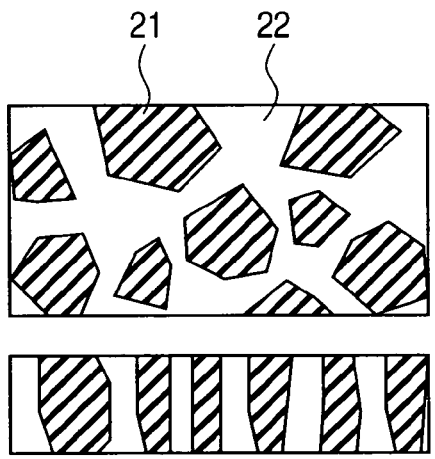
FIGS. 7A, 7B, 7C, and 7D are schematic views showing an example of a structure of a fine-structured layer.
Figure 7B:
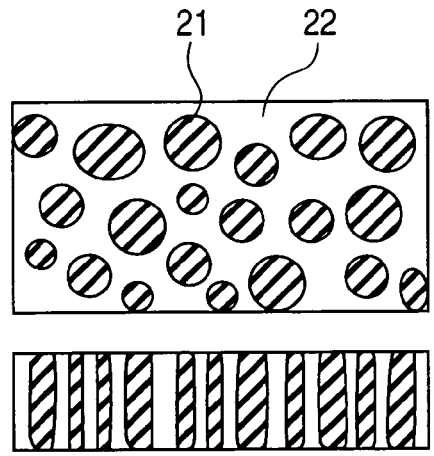
Figure 7C:
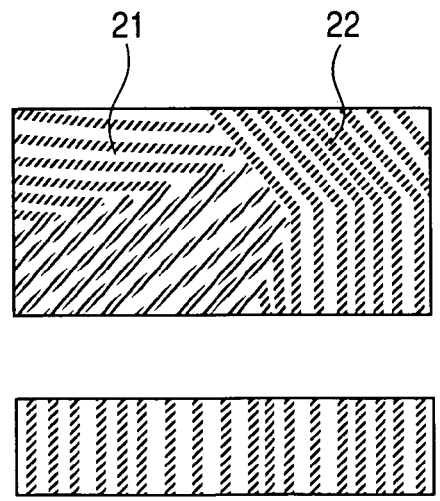
Figure 7D:
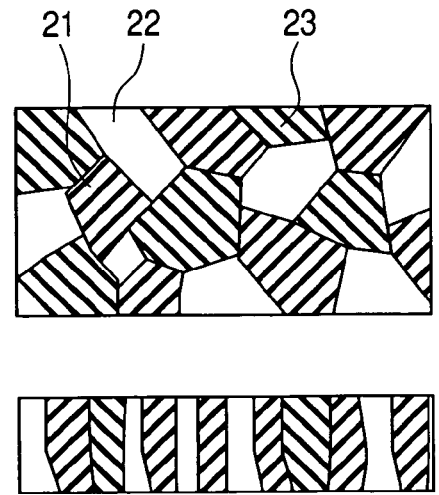

Respectively in FIGS. 7A to 7D, a plan view (upper one) and a sectional view (lower one) are depicted. FIG. 7A is an example of a structure having regions of the first material and the second material; FIG. 7B is an example of a structure having a cylindrical material buried in a matrix; FIG. 7C is an example of a lamellar structure; and FIG. 7D is an example of a structure having regions of the first material 21, the second material 22 and third material 23.

As shown in FIGS. 7A to 7D, the fine-structured layer has plural parts consisting of different materials (the first part 21 consisting of the first material and the second part 22 consisting of the second material). The fine-structured layer is stacked onto the layer 23 consisting of still another third material to form a triple junction with geometry of a closed line. The sizes of the respective parts are in the order of several nanometers to several micrometers.

The structure in FIG. 7B has columnar parts (first-material part 21) is buried in a matrix (second material part 22). Otherwise, a lamellar structure such as shown in FIG. 7C is included. These structures can be produced in self-organizing techniques utilizing a eutectic reaction, and therefore can be described as a preferable structure from the point of view of low-cost production. In FIG. 7D, an example having three parts of different materials is depicted.

The thickness of the fine-structured layer is within the range of several nanometers to several 100 nanometers. As to the material for constituting the fine-structured layer, there is no limitation as long as it is a dielectric material. From the point of view of ensuring stable dielectric property at the time of application of a high electric field and effective electron acceleration (at the time of light emission), it is preferable to use an oxide. For example, $SiO_2$, $Al_2O_3$, $TiO_2$, $Y_2O_3$, $Ta_2O_5$, $HfO_2$, $ZrO_2$, $La_2O_3$, MgO, $BaTiO_3$ and the like are included. In order to control the dielectric constant, a composite oxide thereof may also be used.

Reduction in size of the first and second parts in the fine-structured layer leads to increase in density of the triple junctions and consequently leads to increase in light-emitting sites. Moreover, this is more preferable from the point of view of in-plane uniformity of light emission characteristics.

In addition, it is preferred that the first and the second parts are arranged to form periodical structures. That is, a configuration in which first parts are arranged regularly in a second part is a more preferable configuration. This structure enables the device with in-plane uniformity of light emission characteristics, where similar light-emitting sites are densely arranged.

In the case of taking out a light from the substrate side, it is preferable that the substrate 10 is made of transparent glass or plastic such that the emitted light transmits therethrough. In the case of taking out a light from the top of the device as shown in FIG. 1A, the type of the substrate is not limited. In this case, as the substrate, glass, plastic, ceramic and semiconductor substrate etc. are utilizable.

It is preferable that the transparent electrode layer 17 has both features of conductivity for functioning as an electrode and transparency that allows the emitted light to transmit therethrough. Examples thereof include a transparent conductive film such as doped $In_2O_3$, $SnO_2$, ZnO, ITO, or the like.

As the electrode layer 11, respective kinds of metals, alloys and transparent conductive films such as Al, Au, Pt, Ag, Ta, Ni and the like can be utilized. As the first and the second insulating layers 12 and 16, there may be included dielectric such as $SiO_2$, $Si_3N_4$, $Al_2O_3$, $TiO_2$, $Y_2O_3$, $Ta_2O_5$, $BaTiO_3$ and the like. The film thickness of the insulating layers is generally within the range of several 100 to several micrometers.

The light-emitting layer 14 is a layer that emits light under operation. The thickness of the light-emitting layer is preferably within the range of 50 nm to 1 μm. As for the material constituting the light-emitting layer, the above described light-emitting materials can be used.

For film formation of the fine-structured layer, light-emitting layer, transparent conductive layer and electrode layer, there may be used any thin film formation method including a gas phase method such as vacuum evaporation, sputtering, electron beam evaporation, etc., a liquid phase method such as plating, etc. and a solid-phase method such as sol-gel process, etc.

In particular, for producing the above described fine-structured layer, a eutectic reaction may be preferably used. Especially the sputtering method that can supply high energy particles to a substrate is preferable method to use eutectic reaction.

Figure 9A:
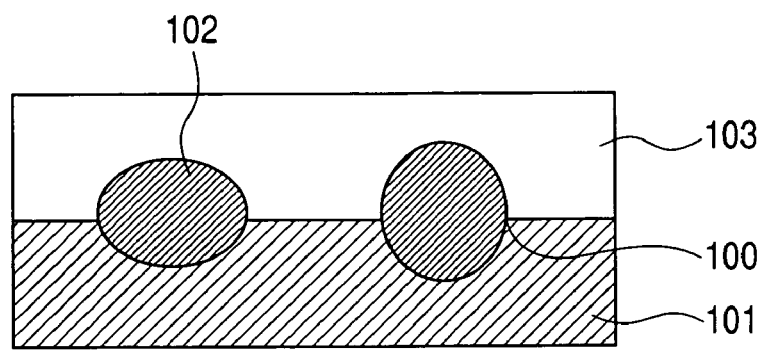
FIGS. 9A, 9B and 9C are sectional views showing a configuration of a triple junction.
Figure 9B:
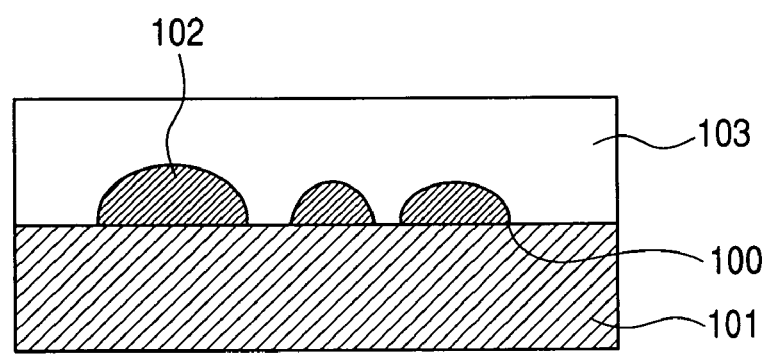
Figure 9C:
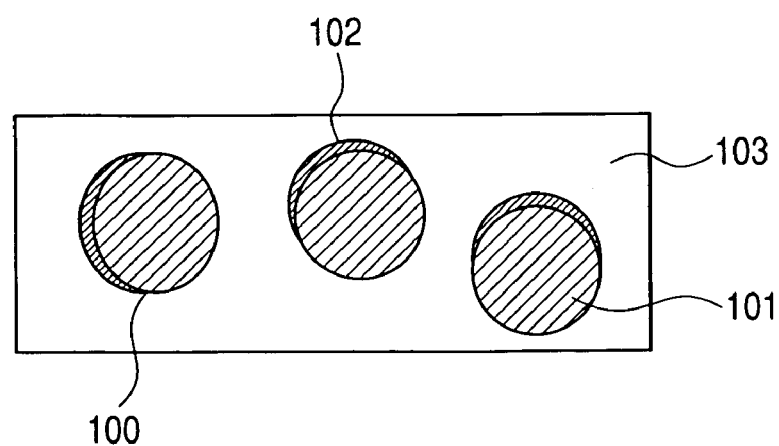

FIGS. 9A, 9B and 9C show a method of providing a triple junction in a configuration different from the example shown in FIG. 1 in which the fine-structured layer is provided.

First, as shown in FIG. 9A, a configuration is included in which a second part 102 consisting of a second dielectric material with a fine particle shape is embedded in a layer structure of a first part 101 consisting of a first dielectric material and a second part 103 consisting of a third dielectric material to form a triple junction 100.

Secondly, as shown in FIG. 9B, a second part 102 consisting of an island-shaped film is formed on a layer (substrate)

101 as a first part, and thereon a layer (a third part) 103 is further over-coated to form a triple junction (point) 100.

Thirdly, as shown in FIG. 9C, a configuration is included in which a part of the surface of a fine particle 101 (as a first part) is covered with a second part 102, and thereafter the fine particles are dispersed in a film 103 as a third part to form a triple junction (point) 100.

With such methods, a plurality of triple junctions with geometry of closed curve may be formed.

EXAMPLES

The present invention will be further described by way of examples as follows. However, the present invention will not be limited to the following examples but includes those included in the above described concepts.

Example 1

A light-emitting device of the present example has a configuration similar to the configuration shown in FIGS. 1A and 1B.

FIG. 1A is a schematic view showing a configuration of a light-emitting device in accordance with the present invention, and FIG. 1B is an enlarged view of a portion indicated by a chain circle in FIG. 1A.

In the figures, reference numeral 10 denotes a substrate; reference numeral 11 denotes an electrode layer; reference numeral 12 denotes a first insulating layer; reference numeral 13 denotes a first fine-structured layer; reference numeral 14 denotes a light emitting layer; reference numeral 15 denotes a second fine-structured layer; reference numeral 16 denotes a second insulating layer; reference numeral 17 denotes a transparent electrode layer (second-electrode layer); reference numeral 18 denotes a power supply; and reference numeral 19 denotes light. However, the present example is configured with the first insulating layer 12 and the second fine-structured layer 15 being omitted.

As shown in FIG. 7B, the fine-structured layer of the present example has, inside the layer plane, a first part 21 consisting of a first material and a second part 22 consisting of a second material. The first part 21 and the second part 22 in FIG. 7B respectively correspond to the second part 102 and the third part 103 in FIGS. 1A and 1B. Further, the first material contains alumina (dielectric constant: ~8) as a main component, while the second material contains silicon oxide (dielectric constant: ~4) as a main component. A number of triple junctions with geometry of a closed line will be disposed at an interface between the fine-structured layer and the light-emitting layer (the first part of the first dielectric constant). Incidentally, the light-emitting layer consists of ZnS:Mn (dielectric constant: ~10).

In this example, the triple junction is configured as in FIG. 3E, the magnitude relationship between dielectric constants of the respective parts 101, 102 and 103 is set as in FIG. 4C ($\in1 > \in2 > \in3$) and the arrangement of the light-emitting material is configured as in FIG. 5A (the material of $\in1$ being the light-emitting material).

Description will be made along the production steps.

As the substrate 10, a quartz substrate was used. On the substrate 10, Ta in a thickness of 100 nm was deposited as the electrode layer 11 by a magnetron sputtering method.

Next, the fine-structured layer 13 was formed. The fine-structured layer was produced by firstly forming a structural member made of Al and Si by a magnetron sputtering method and then anodizing the structural member. The structural member made of Al and Si was configured by a cylindrical part containing Al as a main component and a matrix part containing Si as a main component and surrounding the cylindrical part, as shown in FIG. 7B. By anodizing the structural member, a fine-structured layer consisting of a cylindrical part containing alumina as a main component and a matrix part containing silicon oxide as a main component and surrounding the cylindrical part could be prepared.

The structural member made of Al and Si was formed by a magnetron sputtering method by use of a target consisting of a mixture of Al and Si. At this time, in order to uniformly disperse the columnar parts consisting of Al in the Si matrix, it is preferable to set the target so as to face the substrate. Changing the composition ratio of Al to Si makes it possible to control the percentages of the parts of Al and Si. For example, the Al cylinder has a diameter of 1 to 20 nm and the spacing therebetween is 5 to 30 nm.

In the present example, the film with the composition ratio of Al to Si being set to 56:44 was deposited at room temperature and a sputtering power of 120 W. The size of the aluminum part was approximately 8 nm and the spacing was about 12 nm. And the structural member had the configuration that the cylindrical aluminum was buried in the matrix consisting of silicon, as shown in FIG. 2B. The film thickness was about 70 nm.

Subsequently, the structural member made of Al and Si was anodized in a 0.1 M aqueous ammonium tartrate solution at a voltage of about 50 V, where anode of the substrate with the structural member was arranged so as to face a platinum electrode (cathode). The aluminum and silicon of the structural member was oxidized under the anodizing process. Thus, an oxide structural member consisting of the alumina part (first material) and the silicon oxide part (second material) such as shown in FIG. 7B was formed.

The fine-structured layer had a thickness of approximately 80 nm and was configured by disposing the alumina parts with a diameter of approximately 8 nm dispersedly in the matrix of silicon oxide. The silicon oxide part may partly comprise a silicon part not subjected to oxidation.

Next, as the light emitting layer 14, film formation was implemented by an electron beam evaporation method at a substrate temperature 200° C. to deposit ZnS:Mn in a thickness of 500 nm.

Moreover, tantalum oxide was deposited thereon in a thickness of 300 nm as the second insulating layer 16 and then ITO was deposited thereon in a thickness of 200 nm as the transparent electrode layer 17.

The transparent electrode layer and the electrode layer were respectively connected electrically to a power supply for driving. The driving power supply used was a pulse voltage supply. When applying positive and negative rectangular voltages alternately and increasing the voltage gradually, light emission was attained at about 180 V or more. At this time, the pulse width was 1 ms and the pulse repetition frequency was 50 Hz.

In the electric field excitation light-emitting device of the present example, by providing a fine-structured layer, a configuration having triple junctions with geometry of a closed line disposed densely is provided. By accelerating electrons with a locally intensified electric field in the vicinity of the triple junctions, effective excitation of a light-emitting material is attained. This enables uniform light emission in the device plane, and the stability thereof is good.

Example 2

A light-emitting device of the present example has a configuration similar to the configuration shown in FIGS. 1A and 1B.

As shown in FIG. 7B, the fine-structured layer of the present example has, inside the layer plane, a first part 21 consisting of a first material and a second part 22 consisting of a second material. The first part 21 and the second part 22 in FIG. 7B respectively correspond to the second part 102 and the third part 103 in FIGS. 1A and 1B. Further, the first material contains iron oxide (dielectric constant: about 12 to 16) as a main component, while the second material contains silicon oxide (dielectric constant: ~4) as a main component. A number of triple junctions with geometry of a closed line will be disposed at an interface between the fine-structured layer and the light-emitting layer (the first part of the first dielectric constant). Incidentally, the light-emitting layer is made of $Y_2O_3$:Eu (dielectric constant: ~12)

In this example, the triple junction is configured as in FIG. 3E, the magnitude relationship between dielectric constants of the respective parts 101, 102 and 103 is set as in FIG. 4B ($\in 2 > \in 1 > \in 3$) and the arrangement of the light-emitting material is configured as in FIG. 5A (the material of $\in 1$ being the light-emitting material).

Description will be made along the production steps.

As the substrate 10, a quartz substrate was used. On the substrate 10, Pt film in a thickness of 200 nm was deposited as the electrode layer 11 by a magnetron sputtering method. A Ti film in a thickness of 10 nm was pre-deposited as a base layer.

Subsequently, a tantalum oxide thin film of 300 nm in thickness was formed as the first insulating layer 12. Next, the fine-structured layer 13 was formed. The fine-structured layer was made by firstly forming a film made of Fe, Si and O with a magnetron sputtering method and post-heat-treatment at 600° C. in the atmosphere. In the sputtering, a mixture of FeO powder and $SiO_2$ powder in a volumetric percentage of about 30% was used as a target. Thereby, as shown in FIG. 7B, a fine-structured layer consisting of a cylindrical part containing iron oxide as a main component and a matrix part containing silicon oxide as a main component and surrounding the cylindrical part could be prepared.

In the present example, the size of the iron oxide part was approximately 4 nm, the fine-structured layer had the configuration such that the cylindrical member was buried in the matrix consisting of silicon oxide as shown in FIG. 2B, and the film thickness was about 50 nm.

Next, as the light emitting layer 14, film formation was implemented by a sputtering method to deposit $Y_2O_3$:Eu in a thickness of 400 nm, which was subsequently subjected to heat treatment of 700° C.

Further, the second fine-structured layer 15 was formed by following the same procedure as the first fine-structured layer 13.

Moreover, a thin film of tantalum oxide was formed thereon in a thickness of 300 nm as the second insulating layer 16 and then ITO was deposited thereon in a thickness of 200 nm as the transparent electrode layer 17.

The transparent electrode layer and the electrode layer were respectively connected electrically to a power supply for driving. The driving power supply used was a pulse voltage supply. When applying positive and negative rectangular voltages alternately and increasing the voltage gradually, light emission was attained at about 170 V or more. At this time, the pulse width was 1 ms and the pulse repetition frequency was 50 Hz.

In the electric field excitation light-emitting device of the present example, by providing a fine-structured layer, a configuration having triple junctions with geometry of a closed line disposed densely is provided. By accelerating electrons with a locally intensified electric field in the vicinity of the triple junctions, effective excitation of a light-emitting material is attained. This enables uniform light emission inside the device plane, and the stability thereof is good. This attains uniform light emission inside the device plane, and stability thereof is good. Further, by providing the first and the second insulating layers, the device has a high resistance to an excess voltage.

Example 3

A light-emitting device of the present example has a configuration similar to the configuration shown in FIGS. 1A and 1B.

However, the present example is configured with the first insulating layer 12 and the second insulating layer 16 being omitted, since the fine-structured layers have a sufficient insulating property.

In addition, the electrode layer 11 is formed of a transparent electrode, and the present example is a light-emitting device of a type in which a light is taken out from the rear side of the substrate.

As shown in FIG. 7C, the fine-structured layer of the present example has, inside the layer plane, a first part 21 consisting of a first material and. a second part 22 consisting of a second material. The first part 21 and the second part 22 in FIG. 7C respectively correspond to the second part 102 and the third part 103 in FIGS. 1A and 1B. Further, the first material contains zirconia (dielectric constant: about 20 to 25) as a main component, while the second material contains alumina (dielectric constant: ~8) as a main component. A number of triple junctions with geometry of a closed line will be disposed at an interface between the fine-structured layer and the light-emitting layer (the first part of the first dielectric constant). Incidentally, the light-emitting layer is made of $ZnWO_4$ (dielectric constant: 10 to 15).

In this example, the triple junction is configured as in FIG. 3E, the magnitude relationship between dielectric constants of the respective parts 101, 102 and 103 is set as in FIG. 4B ($\in 2 > \in 1 > \in 3$) and the arrangement of the light-emitting material is configured as in FIG. 5A (the material of 61 being the light-emitting material).

As the substrate, a YSZ single-crystal substrate (111) was used. On the substrate, film formation was implemented to deposit ITO in a thickness of 300 nm as the transparent electrode layer 11 with a magnetron sputtering method. The substrate temperature was set to 700° C.

Next, as the first fine-structured layer 13, film formation was implemented to deposit an oxide structural member of Zr and Al in a thickness of 250 nm. A $ZrO_2$ (including 8 mol % of $Y_2O_3$) target and an $Al_2O_3$ target were prepared and binary simultaneous film formation was effected with a magnetron sputtering method. The substrate temperature was set to approximately 800° C. and the atmosphere used was a mixture of Ar and $O_2$. The gas pressure was 0.5 Pa and the flow rate ratio of Ar to $O_2$ was 5:2. The power inputs to the respective targets were adjusted such that the composition ratio of Zr to Al in the formed film was approximately 1:4. In this thin film, the region containing $ZrO_2$ as a main component and the region containing Al$_2$O as a main component were arranged lamellarly as shown in FIG. 2C. The width of the ZrO$_2$ region was approximately 50 nm.

Next, as the light emitting layer 14, film formation was implemented to form a thin film containing ZnWO$_4$ as a main component in a thickness of 400 nm. A ZnWO$_4$ target was prepared and film formation was effected with a magnetron sputtering method. The substrate temperature at the time of the film formation was approximately 800° C. and the atmosphere used was a mixture of Ar and O$_2$. The gas pressure was 0.5 Pa and the flow rate ratio of Ar to O$_2$ was 5:2.

Next, the second fine-structured layer 15 was formed by following the same procedure as the first fine-structured layer 13.

Then, as the electrode layer 17, film formation was implemented with a vacuum evaporation to deposit Al in a thickness of 200 nm, thereby completing a light-emitting device.

The transparent electrode layer and the electrode layer were respectively connected electrically to a power supply for driving. The driving power supply used was a pulse voltage supply. When applying positive and negative rectangular voltages alternately and increasing the voltage gradually, light emission was attained at about 160 V or more. At this time, the pulse width was 1 ms and the pulse repetition frequency was 50 Hz.

In the electric field excitation light-emitting device of the present example, by providing the fine-structured layers excellent in insulating property, the first and the second insulating layers can be omitted. Further, by adopting the configuration having the triple junctions including triple junctions with geometry of a closed line densely, it is possible to attain uniform light emission inside the device plane, and the stability thereof is good.

Example 4

A light-emitting device of the present example is an example with fine-structured layers and light-emitting layers being stacked on each other alternately, as shown in FIG. 8.

After forming a transparent electrode layer 17 on a YSZ single-crystal substrate 10 by following the same procedure as in Example 3, a film made of tantalum oxide with a thickness of 150 nm was formed as a first insulating layer 12.

Subsequently, light emitting layers 14 and fine-structured layers 13 were alternately stacked on each other. The formation procedure of the light-emitting layers and the fine-structured layers was the same as in Example 3. The thicknesses of the light emitting layer and the fine-structured layer were respectively 5.0 nm and 20 nm, and the numbers of the light emitting layers and the fine-structured layers as alternately stacked were each 7.

Subsequently, a film made of tantalum oxide with a thickness of 150 nm was formed as a second insulating layer 16, and moreover as an electrode layer 11, film formation was implemented with vacuum evaporation to deposit Al in a thickness of 200 nm, thereby completing a light-emitting device.

The transparent electrode layer 17 and the electrode layer 11 were respectively connected electrically to a power supply 18 for driving. The driving power supply 18 used was a pulse voltage supply. When applying positive and negative rectangular voltages alternately and increasing the voltage gradually, light emission was attained at about 190 V or more. At this time, the pulse width was 1 ms and the pulse repetition frequency was 50 Hz.

The electric field excitation light-emitting device of the present example is an example in which the fine-structured layers and the light-emitting layers are stacked to thereby dispose the triple junctions densely. This enables uniform light emission inside the device plane, and the stability thereof is good.

Example 5

Figure 6A:
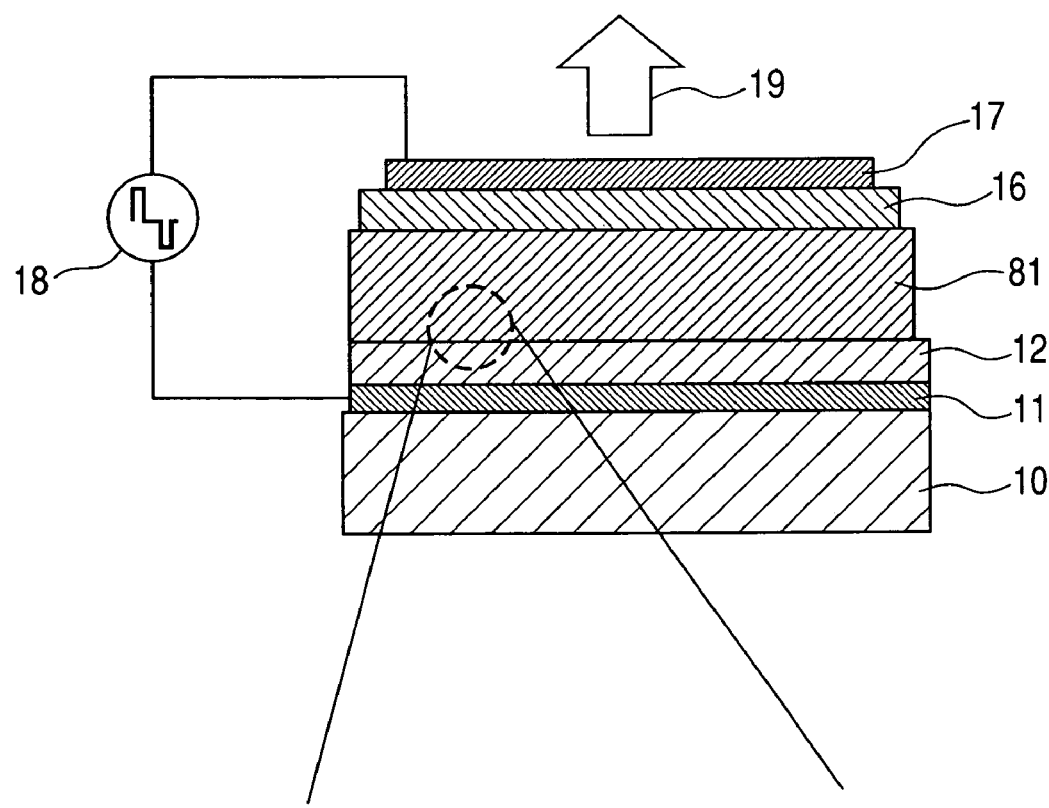
FIG. 6A is a schematic view showing a configuration of another light-emitting device in accordance with the present invention.
Figure 6B:
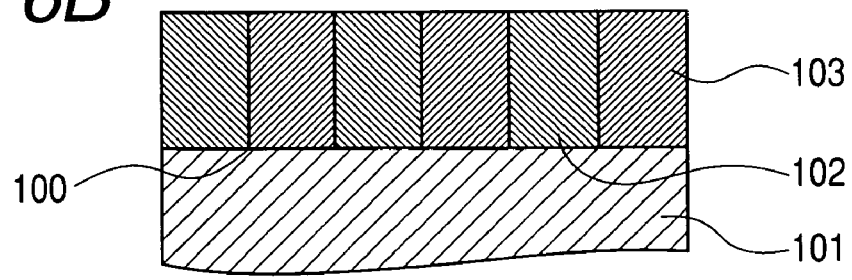
FIG. 6B is an enlarged view of a portion indicated by a chain circle in FIG. 6A.

A light-emitting device of the present example has a configuration shown in FIGS. 6A and 6B, in which a light emitting layer 81 having a fine structure is provided between a first insulating layer 12 and a second insulating layer 16 and triple junctions are disposed between the insulating layers and the light emitting layer.

As shown in FIG. 7B, the light-emitting layer 81 having the fine structure of the present example has, inside the layer plane, parts 21 consisting of a first material and parts 22 consisting of a second material. The first part 21 and the second part 22 in FIG. 7B respectively correspond to the second part 102 and the third part 103 in FIG. 6B.

Further, the first material is a composite oxide of Zn and W (estimated dielectric constant: ~15) and contains ZnWO$_4$ as a main component, while the second material contains zinc oxide (dielectric constant: ~8) as a main component. The first material and the second material are each a light-emitting material. A number of triple junctions with geometry of a closed line will be disposed on interfaces between the light emitting layer having the fine structure and the insulating layers. Moreover, the first insulating layer contains alumina (dielectric constant: ~8) as a main component while the second insulating layer is a composite oxide of Ba and Ti (dielectric constant: ~300). In this example, the triple junction with geometry of a closed line is configured as in FIG. 3E and the arrangement of the light-emitting material is configured as in FIG. 5C.

In this example, the triple junction is configured as in FIG. 3E and the arrangement of the light-emitting material is configured as in FIG. 5C (the materials of ∈2 and ∈3 being light-emitting materials.

As for the magnitude relationship of dielectric constants, the triple junction formed by the first insulating layer and the light-emitting layer 81 having a fine structure is configured as in FIG. 4A (∈2>∈3>∈1) or as in FIG. 4B (∈2>∈1>∈3). The triple junction with geometry of a closed line formed by the second insulating layer and the light-emitting layer 81 having a fine structure is configured as in FIG. 4C (∈1>∈2>∈3).

As the substrate 10, a quartz substrate was used. On the substrate 10, film formation was implemented to deposit Pt in a thickness of 200 nm as the electrode layer 11 with a magnetron sputtering method. As a base layer, a Ti film was deposited in a thickness of 10 nm.

Subsequently, a thin film of alumina was formed in a thickness of 100 nm as the first insulating layer 12.

Next, as the layer 81 having a fine structure, film formation was implemented to deposit an oxide structural member of Zn and W in a thickness of 500 nm. A ZnO target and a WO$_3$ target were prepared and binary simultaneous film formation was effected with a magnetron sputtering method. The substrate temperature was set to approximately 800° C. and the atmosphere employed was a mixture of Ar and O$_2$. The gas pressure was 0.5 Pa and the flow rate ratio of Ar to O$_2$ was 5:2. The power inputs to the respective targets were adjusted such that the composition ratio of Zn to W in the formed film was approximately 2:1. In this thin film, the region containing ZnO as a main component and the region containing ZnWO$_4$ as a main component were arranged as shown in FIG. 7B. The size of the ZnWO$_4$ region was approximately 60 nm.

Next, the second insulating layer 16 was formed. A BaTiO$_3$ target was prepared and a layer of a composite oxide of Ba and Ti was formed in a thickness of 500 nm with a magnetron sputtering method.

Next, as the electrode layer 17, a film of ITO with a thickness of 200 nm was formed, thereby completing a light-emitting device.

The transparent electrode layer and the electrode layer were respectively connected electrically to a power supply 18 for drive. The driving power supply employed was a pulse voltage supply. When applying positive and negative rectangular voltages alternately and increasing the voltage gradually, light emission was attained at about 140 V or more. At this time, the pulse width was 1 ms and the pulse repetition frequency was 50 Hz. The present example is a mixed color light-emitting device that provides a mixture of light emission in the vicinity of the wavelength 500 nm of ZnWO$_4$ and light emission of the wavelength of about 600 nm due to an impurity level of ZnO.

The electric field excitation light-emitting device of the present example has a configuration in which the fine-structured layer of a nano-size is provided to thereby dispose the triple junctions densely. This enables uniform light emission inside the device plane, and the stability thereof is good.

Next, examples of applying the light-emitting device of the present invention to an image display apparatus, a lighting equipment and a printer will be described.

The light-emitting device of Example 1 can be used as an image display apparatus by arranging and wiring these device in a matrix pattern for driving. A color image can be obtained by creating colors through RGB filters using white-light emitting devices. Also, a color image display was constituted by arranging Red, Green and Blue light-emitting device. In addition, with a blue-light emitting device, green and red colors can be obtained by color conversion using a fluorescent material.

Further, in the case where the light-emitting device of the present invention is used in a lighting equipment, there may be used a method of using a white-light emitting device, a method of stacking layers of RGB-light emitting device in the vertical direction and a method of emitting blue or ultraviolet light and then converting the light into light of RGB.

Moreover, the light-emitting device of the present invention can be used for a printer such as a letter printing apparatus by arranging the light-emitting devices in a line and driving them, instead of scanning a laser beam with a polygon mirror.

With the device and production method of the present invention, a light-emitting device can be realized that is excellent in emission uniformity in a light-emitting surface and can be driven stably at a comparatively low voltage. The light-emitting device of the present invention, when using an oxide material as a main component, is characterized by excellent resistance to use environment and less load to environment.

This application claims priority from Japanese Patent Application No. 2004-254837 filed on Sep. 1, 2004, which is hereby incorporated by reference herein.

What is claimed is:

1. A light-emitting device comprising:
   a first part of a first dielectric constant;
   a second part of a second dielectric constant;
   a third part of a third dielectric constant;
   a triple junction where the first, the second, and the third parts are in contact with one another; and
   a first and a second electrodes,
   wherein at least one of the first, the second, and the third parts is constituted by a light emitting material,
   wherein at least one of the first, the second, and the third parts is oriented along a plane,
   wherein the triple junction is positioned in the plane, and
   wherein the triple junction forms a closed line in the plane.

2. The light-emitting device according to claim 1, wherein the light emitting material is excited by using an electric field between the first electrode and the second electrode.

3. The light-emitting device according to claim 2, wherein the closed line is a closed curve.

4. The light-emitting device according to claim 3,
   wherein the closed curve is one of a plurality of closed curves in the plane, and
   wherein each closed curve has a length of not less than 10 nm but not more than 1 μm.

5. The light-emitting device according to claim 1, wherein the light-emitting device is formed on a substrate that includes:
   a first electrode layer as the first electrode;
   a second electrode layer as the second electrode;
   a light-emitting layer as the first part disposed at a location between the first electrode layer and the second electrode layer; and
   a fine-structured layer disposed at a location between the first electrode layer and the light emitting layer,
   wherein the fine-structured layer includes the second part and the third part, and
   wherein the dielectric constant of the light emitting layer as the first part is less than the dielectric constant of the second part and more than the dielectric constant of the third part.

6. The light-emitting device according to claim 1, wherein the light-emitting device is formed on a substrate that includes:
   a first electrode layer as the first electrode;
   a second electrode layer as the second electrode;
   an insulating layer as the first part disposed at a location between the first electrode layer and the second electrode layer; and
   a fine-structured layer disposed at a location between the first electrode layer and the insulating layer,
   wherein the fine-structured layer includes the second part constituted by the light-emitting material and the third part, and
   wherein the dielectric constant of the insulating layer as the first part is less than the dielectric constant of the second part and more than the dielectric constant of the third part.

7. The light-emitting device according to claim 1,
   wherein the light-emitting device is included in an image display apparatus, and
   wherein the image display apparatus includes a display unit for displaying an image by using light emitted from the light-emitting device.

8. A light-emitting device comprising:
   a first part of a first dielectric constant;
   a second part of a second dielectric constant;
   a third part of a third dielectric constant;
   a triple junction where the first, the second, and the third parts are in contact with one another;
   a first electrode; and
   a second electrode,
   wherein at least one of the first, the second, and the third parts is constituted by a light emitting material,
   wherein the triple junction forms a closed line, and
   wherein the first, the second, and the third parts each include an oxide.

* * * * *